(12) United States Patent
Shen et al.

(10) Patent No.: US 7,918,267 B2
(45) Date of Patent: Apr. 5, 2011

(54) HEAT DISSIPATION DEVICE HAVING CAP FOR PROTECTING THERMAL INTERFACE MATERIAL THEREON

(75) Inventors: Hui Shen, Shenzhen (CN); Gen-Ping Deng, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 986 days.

(21) Appl. No.: 11/752,903

(22) Filed: May 23, 2007

(65) Prior Publication Data
US 2008/0289797 A1    Nov. 27, 2008

(51) Int. Cl.
*H05K 7/20* (2006.01)
(52) U.S. Cl. .................. 165/80.2; 165/185; 361/705
(58) Field of Classification Search .............. 165/80.2, 165/185; 361/705
See application file for complete search history.

(56) References Cited

U.S. PATENT DOCUMENTS

| | | | | |
|---|---|---|---|---|
| 3,800,999 | A * | 4/1974 | Serritella | 229/404 |
| 6,029,740 | A * | 2/2000 | Lee et al. | 165/76 |
| 6,049,458 | A * | 4/2000 | Lee et al. | 361/705 |
| 6,935,420 | B1 * | 8/2005 | Dong et al. | 165/185 |
| 7,063,136 | B2 * | 6/2006 | Yu et al. | 165/185 |
| 7,068,514 | B2 * | 6/2006 | Chang et al. | 361/705 |
| 7,365,983 | B2 * | 4/2008 | Huang et al. | 361/704 |
| 7,743,951 | B2 * | 6/2010 | Vogel et al. | 222/556 |
| 2006/0124643 | A1 * | 6/2006 | Markert et al. | 220/254.3 |
| 2006/0180587 | A1 * | 8/2006 | Helms | 220/266 |

* cited by examiner

*Primary Examiner* — Allen J Flanigan
(74) *Attorney, Agent, or Firm* — Jeffrey T. Knapp

(57) ABSTRACT

A heat dissipation device includes a heat sink having a base with thermal interface material thereon and a protective cap covering the base. The protective cap includes a body shielding the thermal interface material and sidewalls extending from the body and engaging with a periphery of the base of the heat sink. A rotatable portion is rotatable relative to the body of the protective cap. The rotatable portion includes a base-wall being rotatably connected with the body of the protective cap and a plurality of positioning sides extending from the base-wall and engaging lateral sides of a corner of the base of the heat sink.

9 Claims, 3 Drawing Sheets

HEAT DISSIPATION DEVICE HAVING CAP FOR PROTECTING THERMAL INTERFACE MATERIAL THEREON

BACKGROUND OF THE INVENTION

1. Field of the Invention

The present invention relates to a heat dissipation device, and more particularly to a heat dissipation device having a removable protective cap for shielding thermal interface material on the heat dissipation device, thereby avoiding the thermal interface material to be contaminated or destroyed before the heat dissipation device is assembled to an electronic package.

2. Description of Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer.

To improve heat conductivity between a heat sink and a CPU, thermal interface material such as thermal grease is often applied to a bottom face of the heat sink. However, thermal grease cannot be applied to the heat sink in advance since it is not solid at ambient temperature and may contaminate surrounding articles or be contaminated by dust or foreign particles before the heat sink is attached to the CPU. Conventionally, thermal grease is applied onto the heat sink just prior to attachment of the heat sink to the CPU. This operation extends the time needed for said attachment.

To overcome the above problem, various grease covers have been developed. The grease covers are attached to a bottom surface of a heat sink to enclose the thermal grease spread on the bottom of the heat sink. The thermal grease cannot be contaminated by dust or foreign particles, and does not contaminate surrounding articles when the heat sink is transported or handled. By using the grease cover, the thermal grease can be applied to the heat sink in advance, thereby simplifying the process of attachment of the heat sink to the CPU. However, usually the grease cover attached to the bottom of the heat sink is either too tightly fitted to be conveniently detached from the bottom of the heat sink or too loose to be readily attached on the bottom of the heat sink.

What is needed, therefore, is a heat dissipation device having a protective cap for thermal interface material which can be readily attached to and conveniently detached from a heat sink of the heat dissipation device.

SUMMARY OF THE INVENTION

A heat dissipation device in accordance with a preferred embodiment of the present invention includes a heat sink having a base with thermal interface material thereon and a protective cap covering the base. The protective cap includes a body shielding the thermal interface material and sidewalls extending from the body and engaging a periphery of the base of the heat sink. A rotatable portion is connected with and rotatable relative to the body of the protective cap. The rotatable portion includes a base-wall rotatably connected with the body of the protective cap and a plurality of positioning sides extending from the base-wall and engaging lateral sides of a corner of the base of the heat sink. By the provision of the rotatable portion, the protective cap can be dimensioned so that it is tightly fitted to the base of the heat sink while it can be conveniently detached from the base of the heat sink by pulling the rotatable portion away from the base of the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
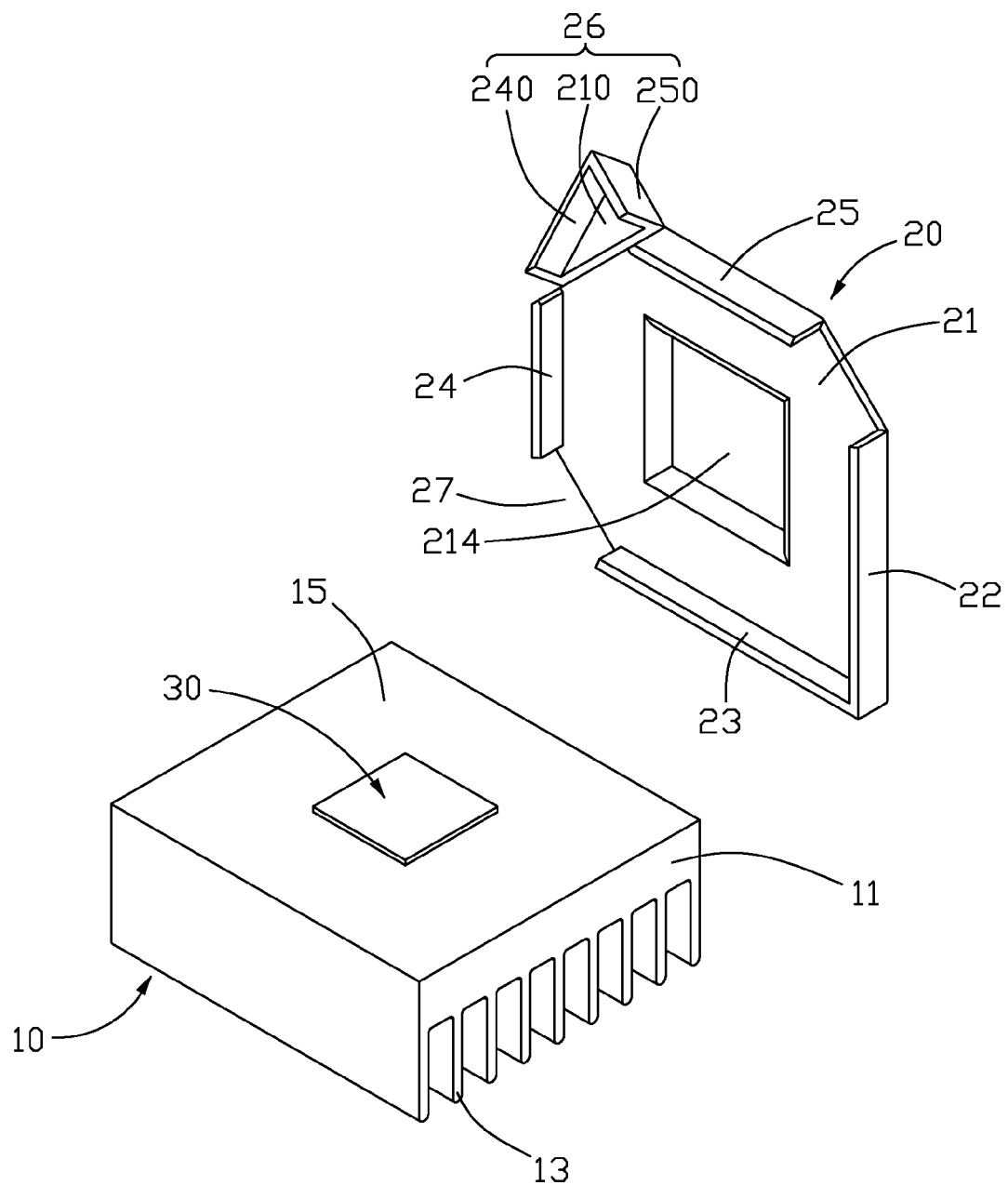
FIG. 1 is an exploded, isometric view of a heat dissipation device in accordance with a preferred embodiment of the present invention.
Figure 2:
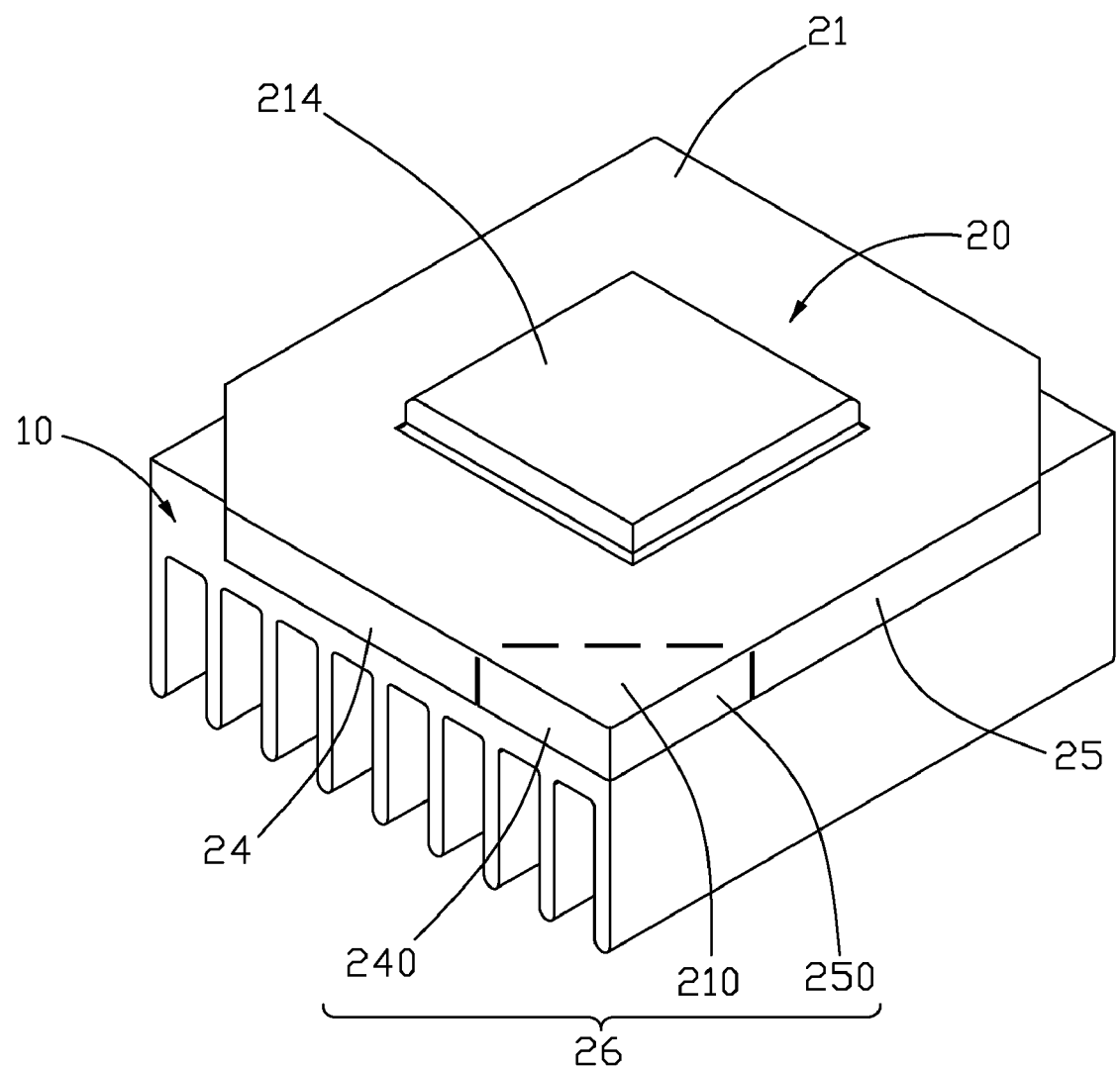
FIG. 2 is an assembled view of FIG. 1.

Referring to FIG. 1 and FIG. 2, a heat dissipation device in accordance with a preferred embodiment of the invention comprises a heat sink 10, thermal interface material 30 such as thermal grease attached on a bottom of the heat sink 10, and a protective cap 20 attached to the bottom of the heat sink 10 for preventing the thermal interface material 30 from being contaminated or destroyed before the heat sink 10 is assembled onto an electronic package, such as a CPU (not shown).

The heat sink 10 comprises a base 11 and a plurality of fins 13 extending upwardly from the base 11. The base 11 has a rectangular configuration and a bottom surface 15 for thermally contacting with the CPU. The fins 13 extend from the base 11 away from the bottom surface 15.

The thermal interface material 30 has a rectangular shape and is evenly spread on a middle portion of the bottom surface 15 of the base 11 of the heat sink 10 by a printing process, preferably a screen printing process.

The protective cap 20 is removably attached to the bottom surface 15 of the heat sink 10 to shield the thermal interface material 30. The protective cap 20 comprises a body 21 and first, second, third and fourth sidewalls 22, 23, 24 and 25 extending perpendicularly from a periphery of the body 21. Two opposite cutouts 27 are respectively defined between the second and third sidewalls 23 and 24 and the first and fourth sidewalls 22 and 25, for facilitating assembly and detachment of the protective cap 20 relative to the base 11 of the heat sink 10. However, the opposite cutouts 27 can be also omitted, which means that the first and second sidewalls 22 and 23 are two adjacent lateral sides and connected with each other at end portions thereof to cooperatively form a positioning corner (not labeled) abutting against lateral sides of a corner of the base 11 of the heat sink 10. A protrusion 214 extends outwardly from a central portion of the body 21 and then defines a cavity (not labeled) in the central portion of the body 21. A rotatable portion 26 has a triangular configuration and is formed at a corner portion of the protective cap 20 by engraving on the corner portion of the protective cap 20 along darkened lines shown in FIG. 2. The rotatable portion 26 and the positioning corner are oriented in a diagonal direction along the base 11 of the heat sink 10. The rotatable portion 26 comprises a base-wall 210 and first and second positioning sides 240, 250 extending perpendicularly from adjacent outer edges of the base-wall 210. The base-wall 210 is rotatable relative to the body 21 at a joint of the base-wall 210 and the body 21. The first and second positioning sides 240, 250 are identical in length and perpendicular to each other and connected with each other at adjacent end portions thereof. Two notches (not labeled) are defined in the first and second positioning sides 240, 250 respectively, so that the first and second positioning sides 240, 250 are located apart from the third and fourth sidewalls 24 and 25, respectively, for facilitating rotation of the rotatable portion 26 relative to the body 21.

Figure 3:
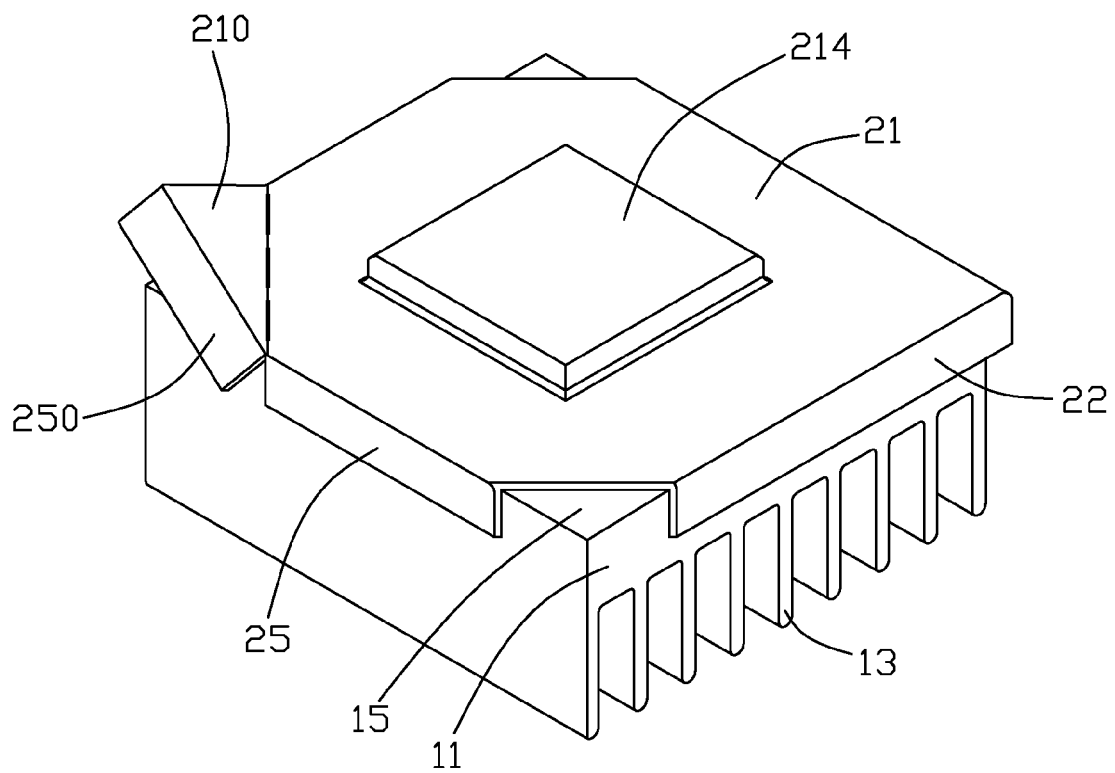
FIG. 3 is the heat dissipation device of FIG. 2 from a different aspect, with a rotatable portion of a protective cap in an unlocked position.

Referring to FIGS. 1-3, when the protective cap 20 is attached to the bottom surface 15 of the base 11 of heat sink 10, the body 21 surrounds the thermal interface material 30 and the first, second, third and fourth sidewalls 22, 23, 24 and 25 interferentially engages with the lateral sides of the base 11 of the heat sink 10. The thermal interface material 30 is enclosed by the cavity but spaced apart from an inner surface of the protrusion 214. Thus the thermal interface material 30 can avoid contamination by dust or foreign particles, and will not contaminate surrounding articles or be destroyed during transportation or handling of the heat sink 10. Furthermore, the first and second positioning sides 240, 250 of the rotatable portion 26 and the first and second sidewalls 22, 23 cover two opposite corners at the diagonal direction of the base 11 of the heat sink 10, respectively, and abut against the lateral sides of the opposite corners of the base 11 of the heat sink 10; thus, the protective cap 20 is tightly attached to the base 11 of the heat sink 10.

To detach the protective cap 20 from the base 11 of the heat sink 10, the rotatable portion 26 is pulled, causing the base-wall 210 of the rotatable portion 26 to rotate at the joint of the body 21 and the base-wall 210 (see FIG. 3). The first and second positioning sides 240, 250 of the rotatable portion 26 are lifted and detached from the lateral sides of a corresponding corner of the base 11 of the heat sink 10. The rotatable portion 26 is further pulled to lift the body 21 and the third and fourth sidewalls 24, 25 are detached from the lateral sides of the opposite corner of the base 11 of the heat sink 10, then the first and second sidewalls 22, 23 are detached from the opposite corner of the base 11 of the heat sink 10 and at last the whole protective cap 20 is detached from the base 11 of the heat sink 10.

By the provision of the protective cap 20, the thermal interface material 30 can be applied to the heat sink 10 in advance. In addition, the protective cap 20 is attached to the heat sink 10 by engaging the sidewalls of the protective cap 20 on the periphery of the base 11 of the heat sink 10, and is removed from the heat sink 10 by rotating the rotatable portion 26 relative to the base 11 of the heat sink 10 and lifting the protective cap 20 from the heat sink 10. Therefore, the assembly and detachment of the protective cap 20 to/from the heat sink 10 is simplified.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink comprising a base with thermal interface material applied to the base; and
a protective cap covering the base and engaging a periphery of the base of the heat sink, the protective cap comprising:
a body shielding the thermal interface material;
first, second, third and fourth sidewalls extending from the body and attached to the periphery of the base of the heat sink, two opposite cutouts being respectively defined between the second and third sidewalls and between the first and fourth sidewalls to render corresponding two corners of the base of the heat sink uncovered by the protective cap, the first and second sidewalls being located at two adjacent lateral sides of the body and connected with each other to abut against two lateral sides of a first corner of the base of the heat sink; and a rotatable portion located at a corner of the body and being rotatable relative to the body, the rotatable portion comprising a base-wall rotatably connected with the body and two positioning sides extending from the base-wall and engaging with two lateral sides of a second corner of the base of the heat sink, wherein the first and second corners are two diagonally opposite corners of the base of the heat sink.

2. The heat dissipation device as claimed in claim 1, wherein the body of the protective cap comprises a protrusion extending therefrom, and a cavity is defined in the protrusion for accommodating the thermal interface material therein.

3. The heat dissipation device as claimed in claim 2, wherein the positioning sides of the rotatable portion are connected with each other at adjacent ends thereof and abut against the lateral sides of the second corner of the base of the heat sink.

4. The heat dissipation device as claimed in claim 3, wherein the positioning sides of the rotatable portion are perpendicular to each other.

5. The heat dissipation device as claimed in claim 1, wherein the first and second sidewalls and the positioning sides of the rotatable portion are oriented along a diagonal direction of the base of the heat sink.

6. The heat dissipation device as claimed in claim 5, wherein the first and second sidewalls are perpendicular to each other.

7. The heat dissipation device as claimed in claim 6, wherein the first and second sidewalls are parallel to the positioning sides of the rotatable portion, respectively.

8. The heat dissipation device as claimed in claim 1, wherein the sidewalls of the protective cap interferentially engage with the lateral sides of the base of the heat sink.

9. The heat dissipation device as claimed in claim 1, wherein two notches are defined in the positioning sides respectively, and the positioning sides are located apart from the third and fourth sidewalls of the protective cap, respectively.

* * * * *